United States Patent [19]

Bonyhard et al.

[11] 4,014,009
[45] Mar. 22, 1977

[54] MAGNETIC BUBBLE PROPAGATE ARRANGEMENT

[75] Inventors: Peter Istvan Bonyhard, Edison; Yu-Ssu Chen, New Providence; James Lanson Smith, Bedminster, all of N.J.

[73] Assignee: Bell Telephone Laboratories, Incorporated, Murray Hill, N.J.

[22] Filed: Nov. 5, 1975

[21] Appl. No.: 629,007

Related U.S. Application Data

[63] Continuation-in-part of Ser. No. 541,884, Jan. 17, 1975, abandoned.

[52] U.S. Cl. .................................. 340/174 T F
[51] Int. Cl.² ................................. G11C 11/14
[58] Field of Search ...................... 340/174 TF

[56] References Cited

UNITED STATES PATENTS

| 3,753,250 | 8/1973 | Yamauchi | 340/174 TF |
| 3,797,001 | 3/1974 | Chen et al. | 340/174 TF |

*Primary Examiner*—James W. Moffitt
*Attorney, Agent, or Firm*—Herbert M. Shapiro

[57] ABSTRACT

Improved magnetic bubble memory operation is achieved with an asymmetric half-disc design for a propagate pattern operative to move the bubbles in a "field-access" mode of operation. The pattern ensures the continuous presence of a elongated supportive magnetic pole geometry for the bubbles during operation.

11 Claims, 13 Drawing Figures

MAGNETIC BUBBLE PROPAGATE ARRANGEMENT

CROSS REFERENCE TO RELATED APPLICATION

The present application is a continuation-in-part of copending application, Ser. No. 541,884, filed Jan. 17, 1975, and now abandoned for the present inventors.

FIELD OF THE INVENTION

This invention relates to magnetic single wall domain devices.

BACKGROUND OF THE INVENTION

The most familiar type of magentic single wall domains are referred to as magnetic bubbles. Magnetic bubbles are cylindrical-shaped areas of magnetization typically maintained in a plane of movement at a nominal operating diameter determined by a bias field antiparallel to the direction of magnetization of the bubble. The most common means for defining the plane of movement for magnetic bubbles is an epitaxial film of garnet grown on a nonmagnetic garnet single crystal as is well established in the art, although of late it has been found possible to employ bubbles in amorphous films. The film is characterized by a uniaxial anisotropy normal to the film and thus the magnetization of a bubble and the direction of the bias field align with an axis normal to the film.

U.S. Pat. No. 3,534,347 of A. H. Bobeck, issued Oct. 13, 1970, discloses a technique for moving magnetic bubbles by means of a pattern of magnetically soft (high permeability) elements, typically permalloy, on the surface of the epitaxial film in which the bubbles move. The elements are formed, by photolithographic techniques, in a repetitive pattern along an axis of bubble movement. A magnetic drive field rotating through consecutive orientations in the plane of bubble movement temporarily magnetizes those elements which have long dimensions aligned with the field. As the field rotates, different elements of the pattern become magnetized due to differing orientations of their long dimensions. By arranging the elements so that the long dimensions of consecutive elements in each period of the pattern are aligned with successive orientations of the drive field, a magnetic pole pattern can be made to move along the axis. Since a repetitive pattern is formed by the elements, the moving pole pattern is also repetitive and thus can be made to move a bubble pattern along that axis. If a binary one or a binary zero is represented by the presence or absence of a bubble, respectively, in a position corresponding to each period of the pattern of elements along the axis, information can be represented as moving along the axis as the drive field rotates. Because the bubbles are moved by the drive field without electrical connection to the garnet or to the permalloy elements, this technique of bubble propagation is commonly referred to as the "field-access" mode of operation.

The most familiar pattern of elements for operation in the field-access mode presently is a T and bar-shaped pattern although chevron, Y-bar, T-X and curvilinear geometries, such as disc-shaped and petal-shaped elements for bubble propagation have been disclosed in the art also. Typically, information defined by a bubble-no-bubble pattern is associated with a distribution of "attractive" magnetic poles generated by the elements as the field reorients in a manner to make the next succeeding pole and the next preceding pole, with respect to each bit, attractive and repulsive, respectively. As reorientation of the field occurs, the poles corresponding to the position occupied by a bubble typically become maganetically neutral. In each instance during bubble propagation, the relationships between the distribution, intensity, and timing of the next preceding, the instant, and the next subsequent poles determine a stable range over which bubble operation occurs in practice. Thus, for any given material, the geometries of the propagate elements, in general, determine these relationships.

The stable range over which a bubble device operates is usually described by a margin plot of bias field intensity versus drive (rotating) field intensity. It is well established that in any given bubble material, a stable bubble exists over a range of bias fields from a high field at which spontaneous bubble collapse occurs to a low field at which bubble strip-out occurs. This range of bias fields is typically twenty-five oersteds between, for example, eighty-eight oersteds, and one hundred and thirteen oersteds. At a high bias field, the bubble diameter is smaller than it is at a low bias field. The propagate elements are of a fixed dimension determined for an intermediate bias field at which the bubble is at some nominal diameter in order to ensure operation tolerant of variations in drive (rotating) field intensity and to allow for driving a number of memories (i.e., memory chips) with a single drive field. For a given bubble device, at a given bias field intensity and drive field, the geometry of the propagate elements thus determines the margins of operation.

Another important consideration in the fabrication of a practical bubble device is "yield", defined as that percentage of manufactured memory chips which meet specified operating criteria. Defective devices arise primarily from defects in the permalloy elements as a result of processing. Certainly, a propagate pattern which is tolerant of (operative in the presence of) defects such as missing areas or extra areas of permalloy enhances yield. A propagate pattern which enables a high yield of chips operative over prescribed margins also permits a trade-off between yield and margins. Therefore, from a practical standpoint, the geometry of the propagate elements determines the yield.

An added consideration for the design of a propagate pattern is the drive field required to achieve a desired pole strength. Of course, the lower the drive field needed, the lower the power requirements for bubble operation. But the pole strength achieved with a given drive field is determined by the geometry and bulk of the propagate elements. In general and within practical limits, for a given element thickness and shape, the larger the element the less the demagnetizing field which has to be overcome by the drive field for producing the poles which, in turn, produce bubble movement. Therefore, for a bubble of given size, the larger the element the lower the requisite drive field or the greater the pole strength for a given drive field. It should be apparent, then, that the geometry of the propagate element is an important factor also in determining the power requirements of bubble devices.

Additional factors become increasingly important as bubble devices are operated at increasingly higher frequency and as increasingly smaller bubbles are employed. For example, as increasingly higher frequencies are employed, the mobility of the bubbles in magnetic material becomes important. If the bubble movement is nonuniform during a cycle of the rotating field, for example, a bubble could be moving at close to the mobility limit of the material for a portion of the cycle and well below the limit for other portions of the cycle. Under high frequency operation, a bubble may not properly arrive at its next consecutive position in time and may, as a result, be annihilated. A relatively lower frequency might be dictated to avoid such a difficulty or a relatively higher power may be necessary to drive the bubbles at a desirably higher frequency than would be required by a propagate pattern which moved the bubble at a more uniform rate. The desirability of smooth bubble movement insofar as it contributes to low drive field may be appreciated more fully when it is recognized that the rotating field advantageously is generated by a pair of field coils which are elements of a tuned circuit arrangement. Switching of tuned circuits is increasingly difficult as power requirements and/or frequency increase.

The factors relating to bubble size concern the resolution of photolithographic techniques. The period of a propagate pattern is typically four to five (nominal) bubble diameters and requires a bar and a T-shaped element, for example, to be defined in the space of each period. The present state of the art for photolithography in production is about one and one-half microns resolution with the finest detail in the propagation pattern being the spacing between say a bar and a next subsequent T-shaped element. This spacing determines the maximum resolution for the pattern and processing variations cause changes in this spacing. Consequently, a propagate element design which operates well with different spacings between elements for a given period, can be made with relatively greater capacity, or packing density, with present photolithographic techniques. It is apparent accordingly that the geometries of the propagate elements also affect the limits of the frequency of operation and the packing densities.

Detailed studies of bubble propagation indicate that the critical point during operation occurs when a bubble transfers from one propagate element to another. It is at this point in the propagate pattern that intensity, distribution and timing of the poles, and the shape, spacing and bulk of permalloy along with the mobility and uniformity of movement are most determinative of margins and yield.

BRIEF DESCRIPTION OF THE INVENTION

The present invention is based on the recognition that improved operating margins can be achieved in the operation of field-access bubble devices if the propagate pattern is of a geometry such that as the drive field reorients from a given to a next direction for moving a bubble between propagate elements, an elongated, attracting pole is defined in the element to which the bubble moves and that this pole is present for as long a portion of the cycle of the in-plane drive field as possible prior ("early-occurring" with respect) to the neutralization of the instant pole. It was also discovered that a propagate pattern which elongates the pole geometry during transfer of a bubble from element to element properly operates to move the bubble to a position of an attracting pole under widely varying operating conditions. Therefore, a feature of the invention is a layer of material in which magnetic bubbles can be moved and a pattern of elements coupled to the layer for moving the bubbles wherein the element is of a geometry such that it is operative responsive to a magnetic drive field reorienting in the plane of the layer to provide an "early-occurring" elongated attractive pole geometry in a next consecutive element to which a bubble moves.

In a preferred embodiment of this invention, a succession of asymmetric half-disc elements defines an axis of propagation for bubbles. The "flat edge" of each half-disc element aligns with the axis and terminates at each end with a leg which defines a localized pole for a drive field orientation transverse to the axis. The remainder of the half-disc defines a diffuse or elongated pole. Thus as the in-plane field reorients, diffuse and localized poles alternate to move a domain along the axis. Consecutive elements are arranged so that localized poles operate during interelement movement of a bubble to provide an early occurring pole geometry operative to elongate a bubble during transfer from one element to the next subsequent element. The element shape and placement which provides for such an early-occurring, next-successive, attracting pole geometry ensures the continuous presence of an attracting pole even during the vital interelement transfer and also for an elongated pole pattern at that time. The element shape and placement to ensure such a pole geometry during interelement transfer is considered an important feature of the preferred embodiment of this invention.

The asymmetric half-disc is tolerant of defects and variations in spacing between elements, and allows for fewer elements per period. Consequently, relatively high packing densities can be realized also.

The flat edge of each asymmetric element is indented to a depth which is greater at that portion of the disc which is closer to the leg from which a bubble moves during interelement transfer. The purpose of this asymmetry is to avoid inappropriate backwards movement of a bubble during propagation from one element to another. Such backward movement can occur with symmetric disc-shaped elements under low bias (field) conditions.

DETAILED DESCRIPTION

Figure 1:
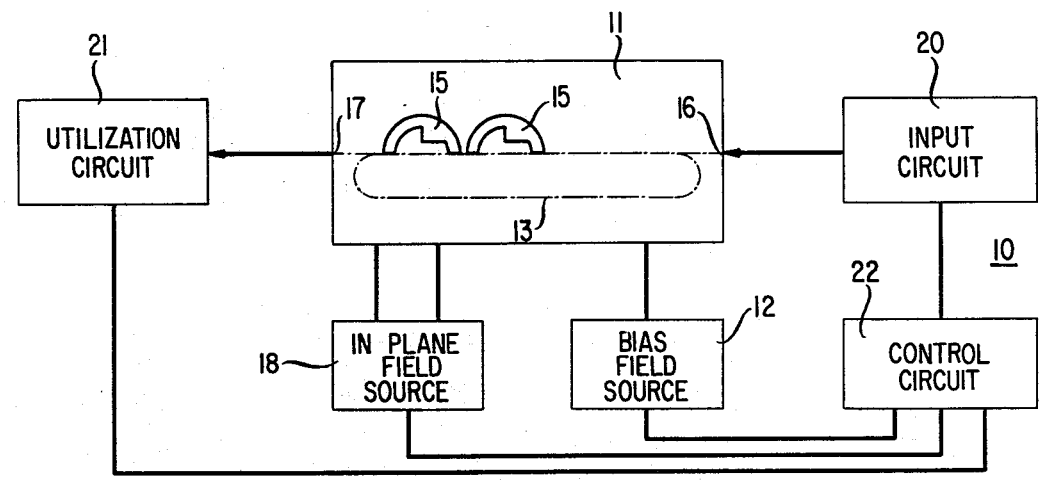
FIG. 1 is a schematic representation of a bubble memory arrangement including a field-access, propagate pattern in accordance with a preferred embodiment of this invention.

FIG. 1 shows a bubble memory 10 including a layer 11 of magnetic material in which magnetic bubbles can be moved. A suitable magnetic layer for bubble movement is a garnet film grown by liquid phase epitaxial techniques on a nonmagnetic garnet substrate or an amorphous film, as is mentioned hereinbefore. Layers of this type are characterized by uniaxial anisotropy out of the plane of the film, typically normal to the plane. A bubble in such a material has its magnetization along an axis normal to the plane, a direction we will assume arbitrarily to be directed upward out of the plane as viewed in the figure. The remainder of the layer has its magnetization directed into the plane along the axis. Bubbles in such a layer typically exist in the presence of a bias field directed antiparallel to the direction of magnetization of the bubble. A bias field source is represented by block 12 in the figure.

An overlay pattern is formed on the (coated surface) of layer 11, in accordance with well-understood photolithographic techniques. The pattern typically defines a number of propagation channels in layer 11, a representative channel, 13, being shown in the figure. The pattern comprises a sequence of elements 15 operatively responsive to a magnetic field rotating in the plane of layer 11 to move bubbles from an input to an output position 16 and 17, respectively. A source of an in-plane field is represented by block 18. Suitable input and output circuits are coupled to layer 11 at positions 16 and 17, respectively, and are represented in the figure by blocks 20 and 21.

Sources 12 and 18 and circuits 20 and 21 are operative under the control of a control circuit 22. The various sources and circuits herein may be any such elements capable of operating in accordance with this invention.

The elements of the propagation pattern typically are of permalloy (an alloy of nickel (80%) and iron (20%)) which is a magnetically soft (high permeability) material. In accordance with the preferred embodiment of this invention, adjacent permalloy elements of the pattern are of, generally, half-disc geometries with a built-in asymmetry as shown.

Figure 2:
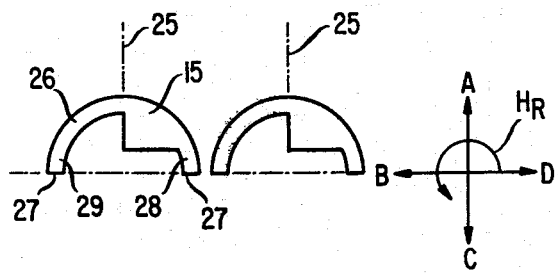
FIGS. 2 through 6 are schematic representations of portions of the arrangement of FIG. 1 showing pole configurations therein during operation.

The geometry of an element can be described most easily with respect to an imaginary vertical axis 25 through the center of a disc as shown in FIG. 2. The element is said to be half-disc-shaped because of the curved top portion 26 and the "flat" base portions 27 as shown in FIG. 2. A portion of the disc is missing as can be seen from the figure. The missing portion extends inwardly from the flat side of the half disc and can be seen to extend into the element more at one end than at the other imparting an asymmetry to the element. The remainder of the disc defines two leg portions 28 and 29 occupied in succession by the bubble during propagation in response to an in-plane field rotating counterclockwise in the plane of layer 11.

Figure 3:
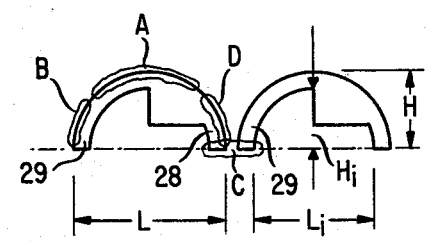

FIG. 2 shows the in-plane field rotating counterclockwise, as represented by the curved arrow $H_R$, through the succession of orientations A, B, C, and D. The positions of a representative diffuse pole moving from right to left, in response, is represented in FIG. 3. The positions for the poles for the succession of field orientations occur along the edge of portions of elements 26 encompassed by closed curve indications designated C, D, A, B. Bubbles occupying these positions are smaller than or occupy the entire position of the poles depending on the value of the bias field.

The critical phase in bubble propagation, which is most determinative of margins in any practical device, occurs when a bubble transfers from one propagate element to the next successive element—phase C in FIGS. 2 and 3. If an elongated attractive pole is generated in an adjacent element during the transfer phase, a bubble moves to occupy the position of that pole—a position which is highly supportive of a bubble.

Figure 4:
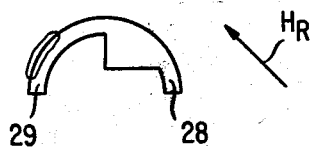
Figure 5:
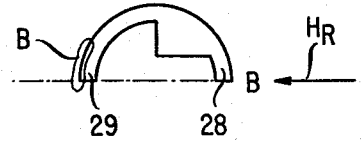
Figure 6:
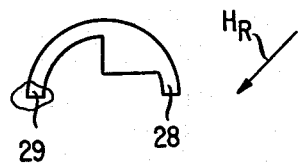

We will assume a bias field which produces a bubble of a size to occupy the entire closed curve indication designated A in FIG. 3. The sequence of FIGS. 3 through 6 conveniently may be taken to show an illustrative bubble in position A in FIG. 3 moving to the left along the curve of a disc to a leg 29 as the field $H_R$ reorients from position A through position B toward position C. FIGS. 4 and 6 show the bubble positions for intermediate field orientations as represented by the arrows $H_R$ in those figures. The bubble can be seen to be spread out at A in FIG. 3, to be less spread out in FIGS. 4 and 5 and to approach bubble form as shown in FIG. 6 for a single illustrative propagate element. If an adjacent element is present as indicated in FIG. 3, the almost circular shape shown for the bubble in FIG. 6 is never achieved for the assumed bias condition. Instead the bubble assumes the shape shown at C in FIG. 3. The pattern of consecutive half discs thus is operative to provide a pole geometry of elongated shape at the point of transfer between elements and maintains that elongated shape as transfer of a bubble occurs. Moreover, the pole at the receiving portion of the next successive element is present prior to the neutralization of the instant pole to ensure the constant presence of a favorable pole for a bubble during operation, the former increasing in strength as the latter weakens and becomes neutral.

It is important to recognize that the relationship between consecutive propagate elements herein is chosen to ensure that the pole to which a bubble moves, in each instance when movement from one propagate element to the next occurs, is generated prior to the weakening and neutralization of the pole at the position presently occupied by the bubble. It is also important to recognize that the pole on the receiving element is an elongated pole and an increasingly stronger pole when the bubble moves between elements. The presence of an elongated pole in this instance leads to a stability which may be analogized to that provided when a person leaps onto a platform as compared to leaping onto a rock. The actual geometry of the bubble (circular or elongated) when the jump occurs depends on the value of the bias field. In either instance, highly favorable pole configurations are present during a critical phase (C) of the propagate operation.

In general, operation under low bias conditions is to some extent dependent on the pole configuration along the "flat" portion of a disc-shaped element. The actual geometry of the element is dictated partially by the desire to eliminate a competing attracting pole when interelement bubble transfer occurs. The missing section of the half disc of each element specifically is designed to prevent a bubble from moving backward across the disc rather than transferring to the next succeeding disc. If the indentation in the base of a disc is not present, attractive poles occur, during a phase C, all along the base of the disc permitting the undesirable backward stripping movement of the domain under low bias conditions thus causing failures.

Figure 7:
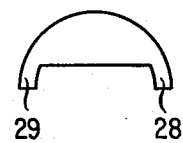
FIGS. 7, 8, 10, 11, 12, and 13 are schematic representations of alternate configurations of elements for the propagation pattern of FIG. 1 showing bubble domains therein during operation.

The strength of the poles which would be generated along the base of a nonindented half-disc element during a phase C may be lessened, to some extent, by a symmetrical indentation in the disc as shown in FIG. 7. Of course, the deeper the indentation the weaker the poles along the base of the disc compared to those on the leg 28 of the next succeeding disc. Unfortunately, the deeper the indentation, the weaker the pole strength on the top of the disc during phase A. It has been found that the asymmetric indentation removes the undesirable effect of the poles along the bottom of a disc during phase C, yet maintains high the pole strength during phase A. The symmetric disc is typically employed with bar-shaped intermediate elements oriented to support transfer between elements during phase C.

Figure 8:
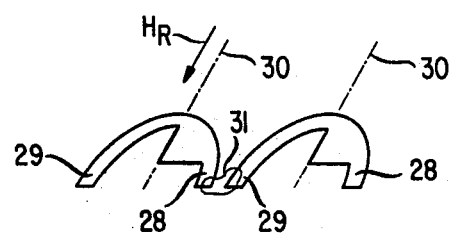

FIG. 8 shows an element geometry with the discs canted along an axis 30 to align a leg 29 with (parallel to) a next succeeding leg 28 so that the pole strength in leg 28 is relatively high when interelement transfer occurs. As a result, a bubble tends to change from the shape shown in FIG. 5 to that shown at C in FIG. 3 relatively early, for example, for the field orientation ($H_R$) shown in FIG. 6 and in FIG. 8 under the (low) bias conditions assumed. The shape of the bubble in this instance is shown at 31 in FIG. 8.

In each of the embodiments of FIG. 3 or FIG. 8, a localized attracting pole, which is becoming increasingly stronger and elongated, is provided in a receiving leg 28 just as a diffused pole is weakening and tending to be condensed into a localized pole in the transferring leg (29) of the next preceding element. It is important that the transferee leg (28) becomes attractive before the pole at (the preceding) leg 29 tends to localize in order to maintain bubble in a supportive environment during transfer.

The appearance of an attractive pole at a transferee position during movement of a bubble between elements ensures particularly good margins at the high end of the bias field range. Typically, bubbles exist over a bias range of about 25 oersteds between a low value at which strip-out occurs and a high value at which collapse occurs as has been mentioned hereinbefore. So long as a strong attractive pole is present at a transferee position, a bubble tends to elongate even under very high bias conditions above the collapse value. As long as the transferor propagate element provides a diffuse pole structure, tending to elongate a bubble just prior to transfer between elements, the tendency for a bubble to remain elongated during transfer is strengthened. Even, for example, if the bias field is at the collapse value, a bubble moved by the element of FIGS. 3 or 8 would maintain the bubble at a diameter greater than the collapse diameter. It is indicated that the bias field can be raised significantly above the collapse value before bubble collapse actually occurs in the presence of elements of the type shown in FIG. 3 or 8.

Significant margin improvements occur at the lower end of the bias range also. The typical failure mode for field-access, bubble devices under low bias conditions is bubble "run out" along a bar in the familiar T-bar circuits and "backwards stripping" in symmetric disc-shaped circuits. The asymmetric indentation in the disc element obviates these "low end" problems.

The combined improvement in margins due to the indented asymmetric disc is unexpectedly large because it provides operation over a range of bias fields from very close to the material strip-out field to beyond the material collapse field. In many experimental circuits, operation over a range of 30 to 40 oersteds was achieved in a bubble material having stability ranges of about 25 oersteds.

Figure 9:
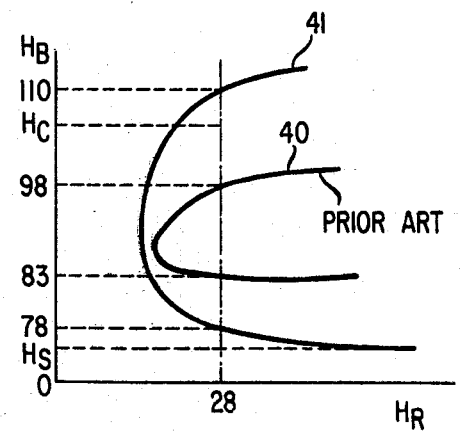
FIG. 9 is a margin diagram of the operation of the arrangements of FIGS. 2 through 6 compared to that of a representative prior art arrangement.

FIG. 9 shows a typical margin plot for bubble circuits using representative T-bar patterns and indented disc patterns. Curve 40 represents the T-bar margins; curve 41 the asymmetric disc margins. Significant improvement is apparent and amounts to a 17-oersted improvement at a typical 28-oersted rotating field. For the T-bar circuit, operation occurs over a range of from 83 to 98 oersteds of bias field $H_B$. For the disc circuit, operation occurs over a range of from 78 oersteds to 110 oersteds.

Indented disc patterns having a period of sixteen microns have been built and tested with the operative margins described. A typical element in a test circuit had a length L of 14 microns by a height H of 8 microns at the center as shown in FIG. 3. The indentation extended for a length $L_i$ of 10 microns and was 6 microns at its deepest point $H_i$. The gap between elements was 2 microns. A nominally sixty-four thousand bit circuit having a sixteen-micron period occupies a chip about 180 mils by 220 mils. Circuits of this size are operated typically as a major-minor organization which is well known in the art.

The major-minor organization operates to move bubbles in channels defined as closed (minor) loops from which transfer of information (bubble patterns) to an accessing (major) loop occurs at transfer positions. In such organizations, the bubble memory usually requires special functions in addition to the propagation function. An important one of these functions is the turn which permits a closed loop to be defined for bubble recirculation. The importance of the turn is twofold. First, the geometry of the typical propagate element is changed, of necessity, simply because of geometry consideration, i.e., movement of a bubble around a curve rather than along a straight line. The second reason is that transfer usually occurs at the turn and the transfer or replicate structure has to be compatible with the turn geometry.

Figure 10:
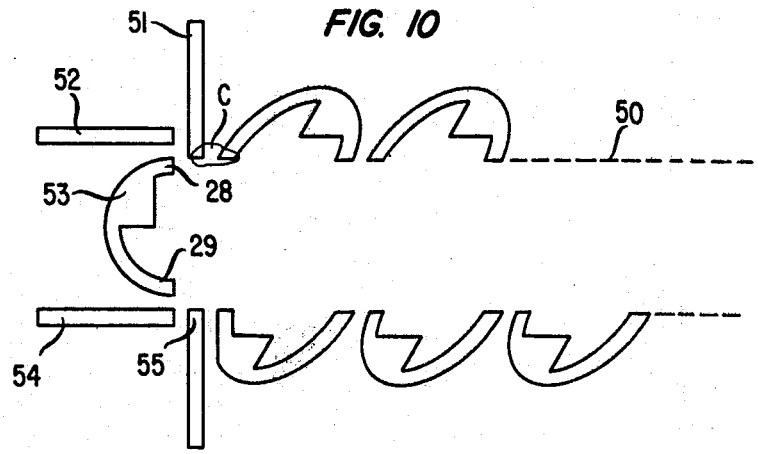

FIG. 10 shows the permalloy disc pattern for a representative bubble recirculating loop 50 including a turn. A bubble moves counterclockwise in loop 50 in response to an in-plane field reorienting counterclockwise in the plane of the bubble layer. The turn comprises five elements 51, 52, 53, 54, and 55. Elements 51, 52, 54, and 55 illustratively are bars as can be seen from the figure. But bars detract from the overall margins relatively little when they are employed at a turn whereas they tend to reduce margins significantly if employed in each period of the propagate pattern.

In general, bars are not employed because they tend to cause a strip failure along the bar at a field greater than the material strip-out field as already mentioned hereinbefore. However, since there are very few corners compared to the number of propagate elements, the use of bars at a corner does not significantly reduce the overall margins. Moreover, a turn allows for the positioning of additional bars 52 and 54 which along say leg 28 of element 53 provides for a strong pole for a domain entering the turn.

Figure 11:
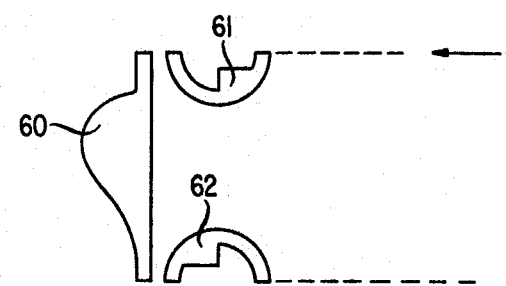

FIG. 11 shows an alternative all-disc turn design which is operative to provide both an early and an elongated pole configuration for bubbles at a turn of a closed loop for a bubble moving counterclockwise in response to a drive field rotating clockwise. A single disc 60 defines a turn between asymmetric half discs 61 and 62 shown canted as in FIG. 10. The bubble moves along the base of element 60 in this instance.

Figure 12:
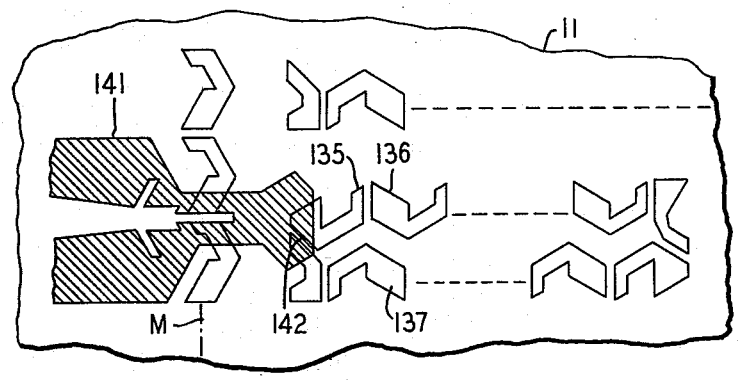

FIG. 12 shows an alternative asymmetric disc-shaped geometry for elements in accordance with another embodiment of this invention. The discs in FIG. 12 are angular rather than smooth in geometry and actually may be thought of as asymmetric chevron-shaped elements of the type disclosed in copending application Ser. No. 592,175, filed July 1, 1975 for A. H. Bobeck. Elements 135, 136, etc., form a loop similar to loop 50 of FIG. 10 and conductor 141 represents a replicate conductor for forming an image of the data in a major path M with which the minor loop comes into close proximity at turn 142. Whether the elements are smooth as shown in FIG. 2 or angular as shown in FIG. 12, operation is exactly the same. Actually, the degree of smoothness of any element is a product of the mask-making facility which controls the x—y movement of the beam for exposing photosensitive plates which serve as masks when developed. It is specifically intended that the asymmetric chevron such as shown in FIG. 12 or chevron elements having, for example, bifurcated end portions to provide asymmetry be encompassed by this invention as claimed hereinafter.

Figure 13:
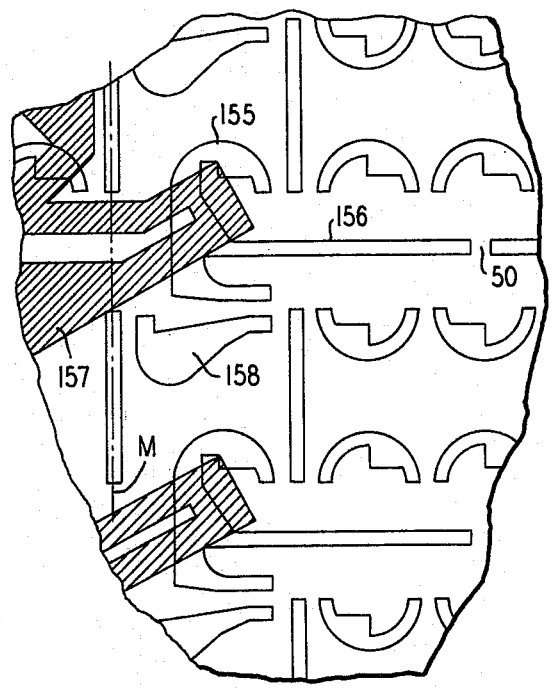

FIG. 13 shows a turn geometry for an element 155 adaptable for functions such as replication. The element again is (illustratively) of a permalloy material having a head portion formed by two asymmetric discs abutting at a 90° orientation and having an extended stem 156 aligned with the axis of the minor loop. Conductor 157 illustrates the replicate conductor for major-minor operation. Turns of this type are characterized for example by margin range extending from about 140 to 170 oersteds. The margins for replication of information are approximately the same.

Similar turn geometries eliminated the extended stem structure while still retaining the very high margin characteristics.

It has been mentioned herein that a half-disc overlay pattern makes less of a demand on photolithography and is tolerant of defects. A consideration of some dimensions in the pattern illustrates this point. For a sixteen-micron period operative to move bubbles of about a four-micron diameter, a single indented disc per period measures about fourteen microns along the base. A two-micron defect can occur in any one of many portions of the disc with only negligible effect on a bubble during operation. With a T-bar geometry, each elongated element has a width of only little more than two microns. A two-micron defect is more likely to be fatal in such a pattern.

Moreover, the disc pattern is less sensitive to the spacing between elements. A disc pattern can operate with larger or smaller spacings between adjacent elements than can T-bar patterns. Therefore, underetching or overetching which might occur during photolithographic processing is less of a problem. The normal spacings between T and bar-shaped elements are such that even a small degree of underetching or overetching can be fatal for a T-bar structure.

Bubble propagate elements of half-disc geometries of the type disclosed herein are operative to move a bubble about the periphery of a half-disc during one-half cycle of the in-plane field and from one element to the next during the next half cycle. The later movement is over a distance typically slightly greater than one-eighth of the period of the permalloy pattern in the test circuits. This movement is to be compared with T-bar circuits where a bubble virtually stops for one-half cycle at the receiving end of the T-shaped element. Movement of a bubble in a side-by-side disc arrangement as shown herein is decidedly smoother than hitherto achieved movement with other element geometries leading to relatively high operating speeds. For example, for a given material and period, a device with a half-disc geometry may be operated at almost twice the speed allowed by an analogous device with a T-bar geometry.

It might also be noted that for a given period, only a single asymmetric half-disc element is present. A device with a single element per period obviously may have a larger element for any specified period than a device requiring more than one element per period. It follows, then, that the drive fields required with asymmetric disc geometries are lower than are required with, for example, prior art T-bar geometries.

What has been described is considered merely illustrative of the principles of this invention. Therefore, various modifications of this invention can be devised by those skilled in the art in accordance with those principles as encompassed by the following claims.

What is claimed is:

1. A magnetic arrangement comprising a layer of material in which a single wall domain can be moved from a first to a next consecutive second position and a pattern of elements adjacent a surface of said layer and responsive to a magnetic field reorienting in the plane of said layer for generating magnetic poles for moving single wall domains in said layer, said pattern including first and second consecutive elements aligned along an axis of domain movement and defining said first and second positions respectively, each said element having a geometry such as to be operative responsive to said field for generating an attracting magnetic pole in said second position prior to the neutralization of the pole in said first position, said element also having a geometry to provide an elongated pole configuration for supporting a domain during movement from said first to said second position.

2. An arrangement in accordance with claim 1 wherein said first and second elements also have geometries to eliminate attracting magnetic poles in close positions next preceding said first position along said axis when said in-plane field is oriented for transfer of a domain from said first to said second position thereby tending to avoid improper movement of domains therein.

3. An arrangement in accordance with claim 1 wherein said pattern comprises half-disc elements.

4. An arrangement in accordance with claim 3 wherein said pattern comprises consecutive like half-disc elements.

5. An arrangement in accordance with claim 4 wherein said pattern comprises consecutive asymmetric half-disc elements.

6. An arrangement in accordance with claim 5 wherein said elements are canted in shape.

7. A magnetic bubble arrangement comprising a first layer of material in which single wall domains can be moved and means coupled to said layer for defining a pattern of asymmetric half-disc elements aligned along an axis of movement in said layer and responsive to a magnetic field reorienting in the plane of said layer for moving domains along said axis.

8. A magnetic bubble arrangement in accordance with claim 7 wherein said half-disc elements comprise permalloy.

9. A magnetic arrangement including a layer of material in which magnetic bubbles can be moved along an axis from first to associated second positions and a pattern of elements adjacent a surface of said layer and responsive to a magnetic field reorienting in the plane of said layer for generating magnetic poles for moving bubbles in said layer, said pattern including a first element for defining a first position therein, said first element having a geometry to provide an elongated and increasingly localized pole configuration in said first position when said field rotates from a first to a second orientation, said pattern also including a second element adjacent said first element for defining an associated second position, said second element being responsive to said field rotating from said first to said second orientation to provide a localized and increasingly elongated pole configuration in said associated second position, said second element being positioned to cooperate with said first element to provide an elongated pole tending to elongate and move a bubble from said first to said associated second position, said first and second elements having geometries to provide diffuse pole configurations responsive to said magnetic field during movement of domains from first to next consecutive second positions.

10. A magnetic arrangement in accordance with claim 9 wherein each of said elements is characterized by a half-disc-shaped geometry terminating in legs having long dimensions transverse to said axis.

11. A magnetic arrangement in accordance with claim 9 wherein each of said elements is characterized by an asymmetric half-disc-shaped geometry terminating in legs having long dimensions transverse to said axis.

* * * * *